(12) United States Patent
Schacht et al.

(10) Patent No.: US 6,365,720 B1
(45) Date of Patent: Apr. 2, 2002

(54) METHOD FOR PRODUCING THERMALLY CLEAVABLE, SOLUBLE PIGMENT DERIVATIVES

(75) Inventors: Hans-Thomas Schacht, Rheinfelden (DE); Ramaswami Sreenivasan; Mudaliar Dayal Chandrasekhar, both of Mumbai (IN); Gilbert Moegle, Magstatt-le-Bas (FR); Barbara Wagner, München (DE); Charles Edward Monnier, Bottmingen (CH)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 0 days.

(21) Appl. No.: 09/868,679

(22) PCT Filed: Dec. 16, 1999

(86) PCT No.: PCT/EP99/10006

§ 371 Date: Jun. 20, 2001

§ 102(e) Date: Jun. 20, 2001

(87) PCT Pub. No.: WO00/39221

PCT Pub. Date: Jun. 6, 2000

(30) Foreign Application Priority Data

Dec. 29, 1998 (CH) .............................................. 2585/98

(51) Int. Cl.⁷ .............................................. C09B 67/20
(52) U.S. Cl. ........................ 534/732; 540/130; 560/25
(58) Field of Search ........................ 534/732; 540/130; 560/25

(56) References Cited

U.S. PATENT DOCUMENTS

| | | | |
|---|---|---|---|
| 5,750,758 A | 5/1998 | Zambounis et al. | 558/276 |
| 6,013,777 A * | 1/2000 | Hao et al. | 534/732 |
| 6,274,728 B1 * | 8/2001 | Hall-Goulle et al. | 540/130 |
| 6,284,036 B1 | 9/2001 | Homma et al. | 106/493 |

FOREIGN PATENT DOCUMENTS

| | | |
|---|---|---|
| EP | 0761772 | 3/1997 |
| WO | 98/32802 | 7/1998 |

\* cited by examiner

Primary Examiner—Fiona T. Powers
(74) Attorney, Agent, or Firm—David R. Crichton

(57) ABSTRACT

The invention relates to a method for preparing a compound of the formula $A(D)_x(E)_y$ (I) by reaction of a compound of the formula $A(H)_x(H)_y$ with a pyrocarbonic acid diester of the formula

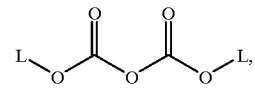

wherein x and y are each independently of the other an integer from 0 to 6, but x and y are not simultaneously the number 0, A is the radical of a chromophore of the quinacridone, anthraquinone, perylene, indigo, quinophthalone, indanthrone, isoindolinone, isoindoline, dioxazine, azo, phthalocyanine or diketopyrrolopyrrole series, which radical is bonded via one or more nitrogen atoms to x groups D and via one or more oxygen atoms to y groups E, the nitrogen atoms and oxygen atoms forming part of the radical A, each group D or E independently of any other(s) is hydrogen or a group of the formula

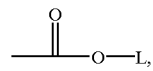

wherein at least one group D or E is not hydrogen, and L is any desired group suitable solubilization, in the presence of a base as catalyst, in which method the reaction takes place in an aromatic or heteroaromatic solvent selected from diphenyl, pyridine, quinoline, pyrrole and benzene unsubstituted or mono- to tri-substituted by $C_1$–$C_6$alkyl, phenyl, benzyl, $C_1$–$C_6$-alkoxy, phenoxy, $C_1$–$C_{24}$alkylthio, halogen and/or by nitro, and any desired mixtures thereof.

By the use of an aromatic solvent, monoazo, bisazo and phthalocyanine pigments in particular are solubilized with surprisingly better results. Both the yield and the purity are markedly higher than in the solvents known hitherto, and more solubilizing groups can be incorporated into the pigment. The method according to the invention is advantageously especially suitable also for the production of latent pigments in relatively large amounts.

12 Claims, No Drawings

METHOD FOR PRODUCING THERMALLY CLEAVABLE, SOLUBLE PIGMENT DERIVATIVES

Thermally cleavable, soluble pigment derivatives (sometimes also called latent pigments) have recently gained importance. It has become known that they can be used advantageously not only in expensive state-of-the-art technologies, for example colour filters, but also, for example, in wood. As a result, the demands made of production processes for their production in high purity are also increasing.

The production of soluble pigment derivatives is known from EP 648 817 and WO 98/32802. In those processes, pigments are reacted inter alia with dicarbonates in a solvent, optionally in the presence of a catalyst A number of solvents are disclosed, including also aromatic solvents such as benzene, toluene, xylene, anisole, chlorobenzene and pyridine. Preference is given to the highly polar solvents N,N-dimethylformamide, N-methyl-pyrrolidone or tetrahydrofuran. In the Examples, only N,N-dimethylformamide, N,N-dimethyl-acetamide or tetrahydrofuran are used.

It has been found, however, that that method does not always yield satisfactory results to the desired extent. Some pigments produce inexplicably low yields or can be reacted only partially, with hydroxy or amide groups that are retained impairing the desired solubilisation (high solubility) of the product. Other pigments react better, but the crude soluble pigment derivatives obtained therefrom exhibit unsatisfactory purity or inadequate storage stability, so that complex purification steps are necessary. Still further pigments give rise to unexpected problems on a pilot scale or production scale.

It has now been found that certain pigments can be solubilised with surprisingly better results if the reaction is carried out with a pyrocarbonic acid diester in an aromatic solvent. Both the yield and the purity are markedly higher, and more solubilising groups can be incorporated into the pigment. The method according to the invention is also excellently suitable especially for the production of latent pigments in relatively large amounts ($\geq 1$ mol).

It is in itself very surprising that a more complete reaction is obtained in, of all things, relatively non-polar solvents in which the pigments and soluble pigment derivatives obtained therefrom are less soluble than in solvents used hitherto.

Accordingly, the invention relates to a method for preparing a compound of the formula $A(D)_x(E)_y$ (I) by reaction of a compound of the formula $A(H)_x(H)_y$ with a pyrocarbonic acid diester of the formula

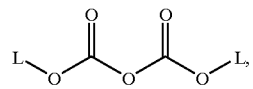

wherein x and y are each independently of the other an integer from 0 to 6, but x and y are not simultaneously the number 0, A is the radical of a chromophore of the quinacridone, anthraquinone, perylene, indigo, quinophthalone, indanthrone, isoindolinone, isoindoline, dioxazine, azo, phthalocyanine or diketopyrrolopyrrole series, which radical is bonded via one or more nitrogen atoms to x groups D and via one or more oxygen atoms to y groups E, the nitrogen atoms and oxygen atoms forming part of the radical A, each group D or E independently of any other(s) is hydrogen or a group of the formula

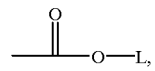

wherein at least one group D or E is not hydrogen, and L is any desired group suitable for solubilisation, in the presence of a base as catalyst, in which method the reaction takes place in an aromatic or heteroaromatic solvent selected from diphenyl, pyridine, quinoline, pyrrole and benzene unsubstituted or mono- to tri-substituted by $C_1$–$C_6$alkyl, phenyl, benzyl, $C_1$–$C_6$-alkoxy, phenoxy, $C_1$–$C_{24}$alkylthio, halogen and/or by nitro, and any desired mixtures thereof.

Aromatic solvents are preferred. Special preference is given to benzene that is unsubstituted or mono- to tri-substituted by $C_1$–$C_{24}$alkyl, $C_1$–$C_{24}$alkoxy or by halogen, for example toluene, o-xylene, mesitylene or isopropylbenzene. Aromatic mixtures, for example Dowtherm® A, may also be used.

A is preferably the radical of a chromophore of the monoazo, disazo or phthalocyanine series. A preferably has at least one immediately adjacent or conjugated carbonyl group at each nitrogen atom bonded to x groups D.

Preference is given to the production of soluble pigment derivatives of the formula $A(D)_x(E)_y$ (I) wherein at least one group D that is other than hydrogen is bonded to the nitrogen atom of a hydrazone or sulfonamide group, or wherein at least one group E that is other than hydrogen is bonded to the oxygen atom of an enol, phenol or naphthol. It is also possible, however, for a plurality, or even all, of the groups D and/or E to be bonded to such nitrogen or oxygen atoms.

In the case of the above-mentioned preferred pigment classes, the complete reaction of all substitutable hydrogen atoms, which is desirable for use in state-of-the-art technologies, has, according to processes used hitherto, surprisingly proved to be impossible when there are more than three substitutable hydrogen atoms. Accordingly, special preference is given to the production of pigment derivatives of the formula $A(D)_x(E)_y$ (I) containing from 4 to 8, especially from 5 to 8, groups D and E that are not hydrogen. Very special preference is given to the production of pigment derivatives of the formula $A(D)_x(E)_y$ (I) wherein all of the groups D and E are each a group of the formula

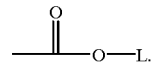

State-of-the-art technologies are, in addition to colour filters, also applications on anodised aluminium or synthetic ceramics, which are the subject of parallel patent applications.

Soluble pigment derivatives having the following partial structures may be mentioned as examples of a group D that is other than hydrogen and is bonded to the nitrogen atom of a hydrazone or sulfonamide group, or of a group E that is other than hydrogen and is bonded to the oxygen atom of an enol, phenol or naphthol:

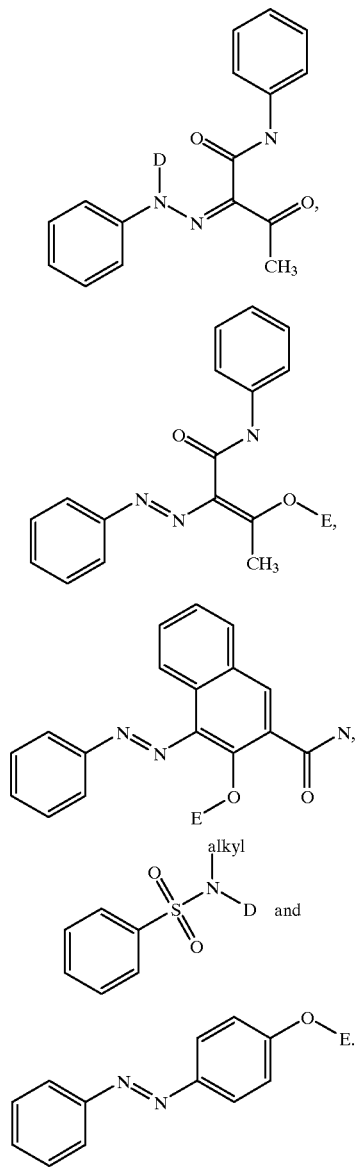

Very special preference is given to the production of soluble pigment derivatives from Colour Index Pigment Yellow 13, Pigment Yellow 93, Pigment Yellow 94, Pigment Yellow 95, Pigment Yellow 128, Pigment Yellow 154, Pigment Red 185 and Pigment Red 222.

Groups suitable for the solubilisation of pigments are known, for example, from the publications mentioned above or from EP 761 772.

L may be any desired group known for the solubilisation of pigments.

L is preferably a group of the formula

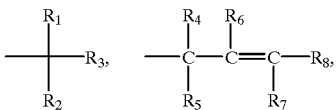

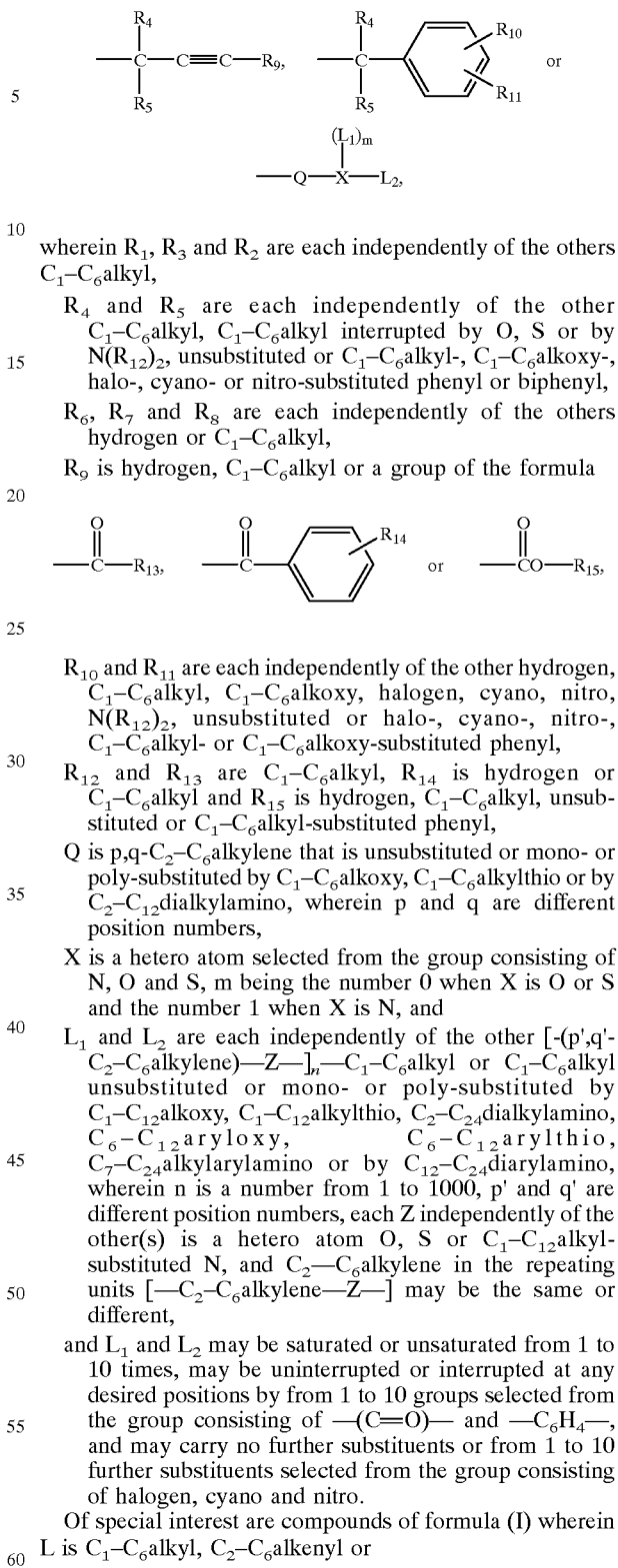

wherein $R_1$, $R_3$ and $R_2$ are each independently of the others $C_1-C_6$alkyl, $R_4$ and $R_5$ are each independently of the other $C_1-C_6$alkyl, $C_1-C_6$alkyl interrupted by O, S or by $N(R_{12})_2$, unsubstituted or $C_1-C_6$alkyl-, $C_1-C_6$alkoxy-, halo-, cyano- or nitro-substituted phenyl or biphenyl, $R_6$, $R_7$ and $R_8$ are each independently of the others hydrogen or $C_1-C_6$alkyl, $R_9$ is hydrogen, $C_1-C_6$alkyl or a group of the formula $R_{10}$ and $R_{11}$ are each independently of the other hydrogen, $C_1-C_6$alkyl, $C_1-C_6$alkoxy, halogen, cyano, nitro, $N(R_{12})_2$, unsubstituted or halo-, cyano-, nitro-, $C_1-C_6$alkyl- or $C_1-C_6$alkoxy-substituted phenyl, $R_{12}$ and $R_{13}$ are $C_1-C_6$alkyl, $R_{14}$ is hydrogen or $C_1-C_6$alkyl and $R_{15}$ is hydrogen, $C_1-C_6$alkyl, unsubstituted or $C_1-C_6$alkyl-substituted phenyl, Q is p,q-$C_2-C_6$alkylene that is unsubstituted or mono- or poly-substituted by $C_1-C_6$alkoxy, $C_1-C_6$alkylthio or by $C_2-C_{12}$dialkylamino, wherein p and q are different position numbers, X is a hetero atom selected from the group consisting of N, O and S, m being the number 0 when X is O or S and the number 1 when X is N, and $L_1$ and $L_2$ are each independently of the other [-(p',q'-$C_2-C_6$alkylene)—Z—]$_n$—$C_1-C_6$alkyl or $C_1-C_6$alkyl unsubstituted or mono- or poly-substituted by $C_1-C_{12}$alkoxy, $C_1-C_{12}$alkylthio, $C_2-C_{24}$dialkylamino, $C_6-C_{12}$aryloxy, $C_6-C_{12}$arylthio, $C_7-C_{24}$alkylarylamino or by $C_{12}-C_{24}$diarylamino, wherein n is a number from 1 to 1000, p' and q' are different position numbers, each Z independently of the other(s) is a hetero atom O, S or $C_1-C_{12}$alkyl-substituted N, and $C_2-C_6$alkylene in the repeating units [—$C_2-C_6$alkylene—Z—] may be the same or different, and $L_1$ and $L_2$ may be saturated or unsaturated from 1 to 10 times, may be uninterrupted or interrupted at any desired positions by from 1 to 10 groups selected from the group consisting of —(C=O)— and —$C_6H_4$—, and may carry no further substituents or from 1 to 10 further substituents selected from the group consisting of halogen, cyano and nitro.

Of special interest are compounds of formula (I) wherein L is $C_1-C_6$alkyl, $C_2-C_6$alkenyl or

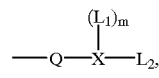

wherein Q is $C_2-C_4$alkylene, and $L_1$ and $L_2$ are [—$C_2C_{12}$alkylene—Z—]$_n$—$C_1-C_{12}$alkyl, or $C_1-C_{12}$alkyl mono- or poly-substituted by $C_1$–$C_{12}$alkoxy, $C_1$–$C_{12}$alkylthio or by $C_2$–$C_{24}$dialkylamino, and m and n are as defined above.

Of very special interest are compounds of formula (I) wherein L is $C_4$–$C_5$alkyl, $C_3$–$C_6$alkenyl or

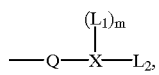

wherein Q is $C_2$–$C_4$alkylene, X is O and m is zero, and $L_2$ is [—$C_2$–$C_{12}$alkylene—O—]$_n$—$C_1$–$C_{12}$alkyl, or $C_1$–$C_{12}$alkyl mono- or poly-substituted by $C_1$–$C_{12}$alkoxy, especially those compounds wherein —Q—X— is a group of the formula —C(CH$_3$)$_2$—CH$_2$—O—.

Alkyl or alkylene may be straight-chained, branched, monocyclic or polycyclic.

Accordingly, $C_1$–$C_{12}$alkyl is, for example, methyl, ethyl, n-propyl, isopropyl, n-butyl, sec-butyl, isobutyl, tert-butyl, cyclobutyl, n-pentyl, 2-pentyl, 3-pentyl, 2,2-dimethylpropyl, cyclopentyl, cyclohexyl, n-hexyl, n-octyl, 1,1,3,3tetramethylbutyl, 2-ethylhexyl, nonyl, trimethylcyclohexyl, decyl, menthyl, thujyl, bornyl, 1-adamantyl, 2-adamantyl or dodecyl When $C_2$–$C_{12}$alkyl is mono- or poly-unsaturated, it is $C_2$–$C_{12}$alkenyl, $C_2$–$C_{12}$alkynyl, $C_2$–$C_{12}$alkapolyenyl or $C_2$–$C_{12}$alkapolyynyl, wherein two or more double bonds may optionally be isolated or conjugated, for example vinyl, allyl, 2-propen-2-yl, 2-buten-1-yl, 3-buten-1-yl, 1,3-butadien-2-yl, 2-cyclobuten-1-yl, 2-penten-1-yl, 3-penten-2-yl, 2-methyl-1-buten-3yl, 2-methyl-3-buten-2-yl, 3-methyl-2-buten-1-yl, 1,4-pentadien-3-yl, 2-cyclopenten-1-yl, 2-cyclohexen-1-yl, 3-cyclohexen-1-yl, 2,4cyclohexadien-1-yl, 1-p-menthen-8-yl, 4(10)-thujen-10-yl, 2-norbonen-1-yl, 2,5-norbomadien-1-yl, 7,7-dimethyl-2,4-norcaradien-3-yl or the various hexenyl, octenyl, nonenyl, decenyl or dodecenyl isomers.

$C_2$–$C_4$Alkylene is, for example, 1,2-ethylene, 1,2-propylene, 1,3-propylene, 1,2-butylene, 1,3-butylene, 2,3-butylene, 1,4-butylene or 2-methyl-1,2-propylene. $C_5$–$C_{12}$Alkylene is, for example, an isomer of pentylene, hexylene, octylene, decylene or dodecylene.

$C_1$–$C_{12}$Alkoxy is O—$C_1$–$C_{12}$alkyl, preferably O—$C_1$–$C_4$alkyl.

$C_6$–$C_{12}$Aryloxy is O—$C_6$–$C_{12}$aryl, for example phenoxy or naphthyloxy, preferably phenoxy.

$C_1$–$C_{12}$Alkylthio is S—$C_{16}$–$C_{12}$alkyl, preferably S—$C_1$–$C_4$alkyl.

$C_6$–$C_{12}$Arylthio is S—$C_6$–$C_{12}$aryl, for example phenylthio or naphthylthio, preferably phenylthio.

$C_2$–$C_{24}$Dialkylamino is N(alkyl$_1$)(alkyl$_2$) wherein the sum of the carbon atoms in the two groups alkyl$_1$ and alkyl$_2$ is from 2 to 24, preferably N($C_1$–$C_4$alkyl)-$C_1$–$C_4$alkyl.

$C_7$–$C_{24}$Alkylarylamino is N(alkyl$_1$)(aryl$_2$) wherein the sum of the carbon atoms in the two groups alkyl and aryl$_2$ is from 7 to 24, for example methylphenylamino, ethylnaphthylamino or butylphenanthrylamino, preferably methylphenylamino or ethylphenylamino.

$C_{12}$–$C_{24}$Diarylamino is N(aryl$_1$)(aryl$_2$) wherein the sum of the carbon atoms in the two groups aryl$_1$ and aryl$_2$ is from 12 to 24, for example diphenylamino or phenylnaphthylamino, preferably diphenylamino.

Halogen is chlorine, bromine, fluorine or iodine, preferably fluorine or chlorine, especially chlorine.

n is preferably a number from 1 to 100, especially a number from 2 to 12.

Reaction at a temperature of from 0 to 160° C., preferably from 10 to 100° C., for from ½ to 80 hours, preferably from 2 to 48 hours, is advantageous. The reaction is carried out especially at from 15 to 60° C. and at a pressure of from 0.8 to 1.2 bar, especially of approximately 1 bar.

The molar ratio in each case is dependent on the number of radicals D and E to be introduced. The dicarbonate is advantageously used in an equimolar amount or in a slight excess, for example from 1 to 1.5 mol, based on 1 mol of hydrogen atoms to be substituted (i.e. the molar amount of dicarbonate corresponds to 1–1.5×number of groups D and E in the molecule of the product of the formula A(D)$_x$(E)$_y$ (I) that are other than hydrogen, per 1 mol of compound of the formula A(H)$_x$(H)$_y$).

It is advantageous to use from 5 to 50 parts by weight of aromatic or heteroaromatic solvent, based on 1 part by weight of compound of the formula A(H)$_x$(H)$_y$.

Bases suitable as catalyst are, for example, the alkali metals themselves, such as lithium, sodium or potassium and their hydroxides and carbonates, or alkali metal amides, such as lithium, sodium or potassium amide, or alkali metal hydrides, such as lithium, sodium or potassium hydride, or alkaline earth metal or alkali metal alcoholates derived especially from primary, secondary or tertiary aliphatic alcohols having from 1 to 10 carbon atoms, for example lithium, sodium or potassium methoxide, ethoxide, n-propoxide, isopropoxide, n-butoxide, sec-butoxide, tert-butoxide, 2-methyl-2-butoxide, 2-methyl-2-pentoxide, 3-methyl-3-pentoxide, 3-ethyl-3-pentoxide, and also organic aliphatic, aromatic or heterocyclic nitrogen bases, including, for example, diazabicyclooctene, diazabicycloundecene and 4-dimethylaminopyridine, and trialkylamines, for example trimethyl- or triethyl-amine. It is also possible, however, to use a mixture of the mentioned bases.

Preference is given to the organic nitrogen bases, for example diazabicyclooctane, diazabicycloundecene and, especially, 4-dimethylaminopyridine.

The amount of catalyst is advantageously from 0.005 to 2 mol, preferably from 0.02 to 1 mol, especially from 0.1 to 0.4 mol, times the number of groups D and E in the molecule of the product of the formula A(D)$_x$(E)$_y$ (I) that are other than hydrogen, based on 1 mol of compound of the formula A(H)$_x$(H)$_y$. Accordingly, for the substitution of a single group there are required from 0.005 to 2 mol of catalyst, while for the substitution of 6 groups there are required from 0.03 to 12 mol of catalyst.

The suitable pyrocarbonic acid diesters of the formula

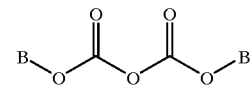

can be prepared analogously to generally known methods. Most of the chemicals required therefor are known. Many are commercially available, and all can be prepared by methods known per se.

The product of the formula A(D)$_x$(E)$_y$ (I) can be isolated from the reaction mixture by conventional methods. It is preferably precipitated with one or more solvents in which it is sparingly soluble, especially with a saturated hydrocarbon, an aliphatic alcohol, water, or a mixture of a saturated hydrocarbon and an aliphatic alcohol or of an aliphatic alcohol and water, it being especially advantageous for the catalyst to remain in solution. Very special preference is given to precipitation with from 50 to 150% by weight solvent in which the product is sparingly soluble, that amount being based on the compound of the formula A(H)$_x$(H)$_y$.

It may be advantageous to reduce the amount of solvent, before the precipitation, to an amount appropriate to the solubility of the product, for example to from 0.5 to 5 parts by weight aromatic solvent, based on 1 part by weight compound of the formula A(H)$_x$(H)$_y$.

The Examples which follow illustrate the invention without limiting the scope thereof:

EXAMPLE 1

In a 1.5 liter reaction vessel equipped with a stirrer, a thermometer and a nitrogen inlet, 50.0 g of Pigment Red 222 are suspended in 500 ml of o-xylene. 4.4 g of dimethylaminopyridine and 88.7 g of di-tert-amyl pyrocarbonate are added at room temperature. The reaction mixture is stirred for 16 hours at 23° C. The solution is then concentrated under reduced pressure at 40° C. to one third of the volume, and then 60 ml of ethanol are added. 600 ml of n-hexane are added dropwise, with rapid stirring. The precipitated product is filtered off, washed with hexane and dried at 40° C./20 mbar, yielding 80.7 9 (98% of the theory) of a light-red powder of excellent purity and having the structure:

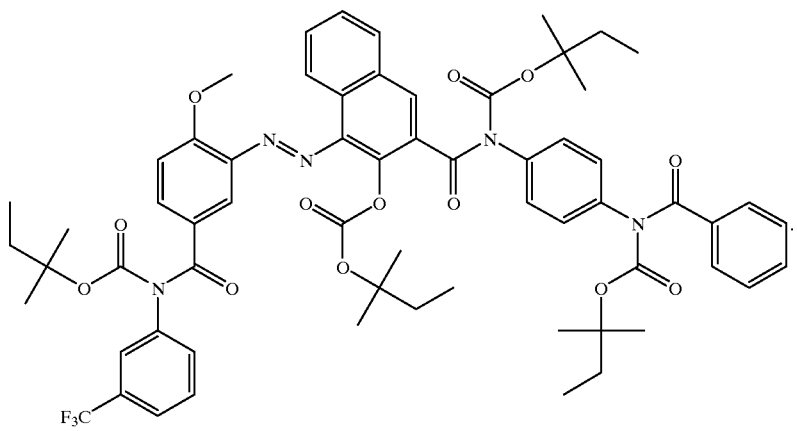

The $^1$H-NMR, TGA and C,N,H,F analytical data correspond to the structure. Purity (determined by HPLC): 99%.

EXAMPLE 2

In a 63 liter reaction vessel, 4.0 kg of Pigment Red 222 are suspended in 36 kg of o-xylene. 352 g of dimethylaminopyridine and 7.1 kg of di-tert-amyl pyrocarbonate are added at 25° C. The reaction mixture is then heated for 3 hours at 40° C., with stirring. The solution is then concentrated under reduced pressure at 40° C., 25 liters of o-toluene being recovered. Precipitation of the red product is initiated with 4 kg of ethanol and completed by addition of 17 kg of hexane. The product is filtered off, washed with 17 kg of hexane and dried at 40° C./20 mbar, yielding 6.39 kg (97% of the theoretical yield) of a powder of excellent purity and having the same structure as in Example 1.

EXAMPLE 3

A suspension of 18.74 9 of Pigment Yellow 93, 1.01 g of dimethylaminopyridine and 34.9 g of di-tert-butyl pyrocarbonate in 200 ml of toluene is stirred for 5½ hours at 40° C. The reaction mixture is filtered off and the filtrate is concentrated to dryness and washed with hexane. The residue is taken up in 100 ml of ethanol and precipitated with 4 liters of deionised water. The precipitated product is filtered off and dried at 40° C./20 mbar, yielding 30.44 g (99% of the theory) of a beige-brown powder, the principal component (78%) of which corresponds to the following structure:

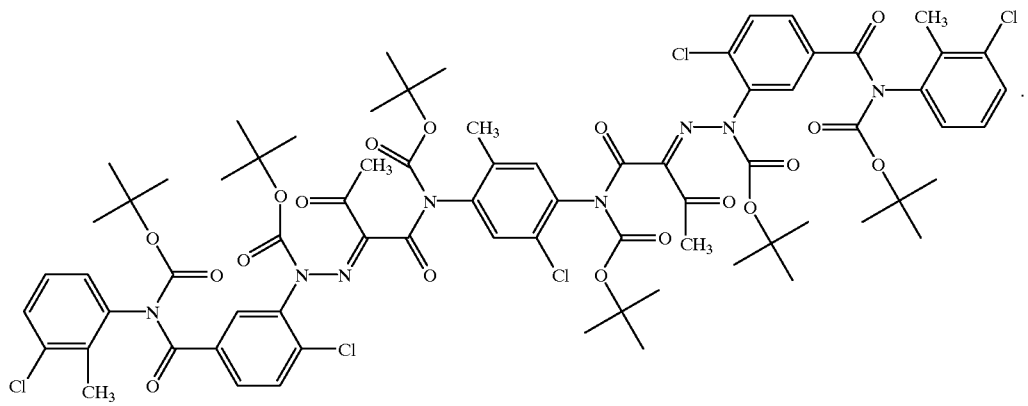

EXAMPLE 4

5.00 g of Pigment Yellow 93, 0.3 g of dimethylaminopyridine and 11.4 g of di-(2-methyl-3-butene-2) pyrocarbonate are suspended in a mixture of 35 ml of o-xylene and 15 ml of pyridine and stirred for 16 hours at 20° C. The reaction mixture is filtered off and the filtrate is concentrated to dryness and washed with hexane. The residue is taken up in 30 ml of ethanol and precipitated with 300 ml of hexane, yielding 7.97 g (89% of the theory) of a beige-brown powder, the principal component (82%) of which corresponds to the following structure:

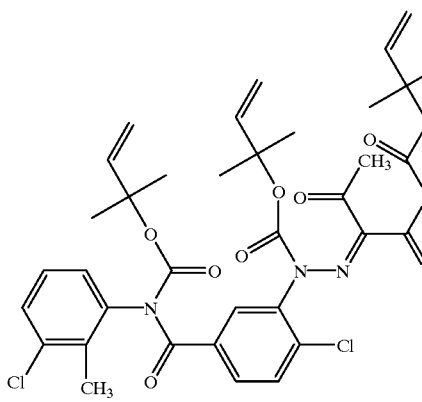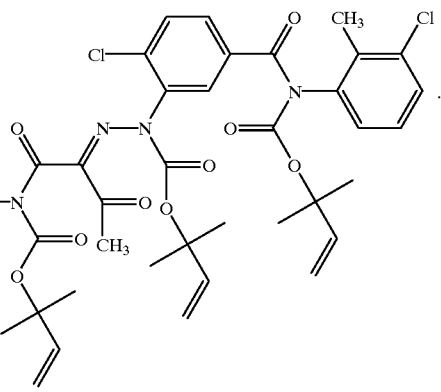

EXAMPLE 5

The product according to Example 1 of WO 98/45756 is first converted into copper phthalocyanine-tetrakis-β-hydroxyethyl-sulfonamide under conventional conditions using ethanolamine. 3.0 g of that product are suspended at 23° C., with vigorous stirring, in 0.5 g of dimethylaminopyridine, 8.0 g of di-tert-butyl pyrocarbonate and 50 ml of toluene. The reaction mixture is stirred for a further 4 hours at 40° C and then filtered through 5 g of kieselguhr (Hyflo Super Cel®, Fluka AG). The filtration residue is then washed with toluene until the eluate is almost colourless. After concentration of the filtrate at ~40° C./30 mbar, 100 ml of a mixture of 75 ml of n-heptane and 25 ml of 2-propanol are added. The precipitate is filtered off, washed with approximately 10 ml of n-heptane and dried at 23° C./–120 mbar, yielding 4.5 9 of a pure blue powder of the formula:

Elemental analysis [%]: ($C_{80}H_{100}O_{28}S_4Cu$) theory: C, 51.40; H, 5.39; N, 8.99; S, 6.86; Cu, 3.40. found: C, 51.18; H, 5.46; N, 9.18; S, 6.83; Cu, 3.56.

Thermogravimetric analysis: weight loss 41.9% [=8×—$COOC(CH_3)_3$].

The product contains neither NH nor OH groups, dissolves to give a clear solution in conventional solvents in high concentrations and produces excellent pigmentations, for example on wood according to the methods disclosed in WO-A-98/58027 and EP-99811238.9.

What is claimed is:
1. A method for preparing a compound of the formula $A(D)_x(E)_y$ (I) by reaction of a compound of the formula $A(H)_x(H)_y$ with a pyrocarbonic acid diester of the formula

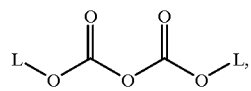

wherein
x and y are each independently of the other an integer from 0 to 6, but x and y are not simultaneously the number 0,
A is the radical of a chromophore of the quinacridone, anthraquinone, perylene, indigo, quinophthalone, indanthrone, isoindolinone, isoindoline, dioxazine, azo, phthalocyanine or diketopyrrolopyrrole series, which

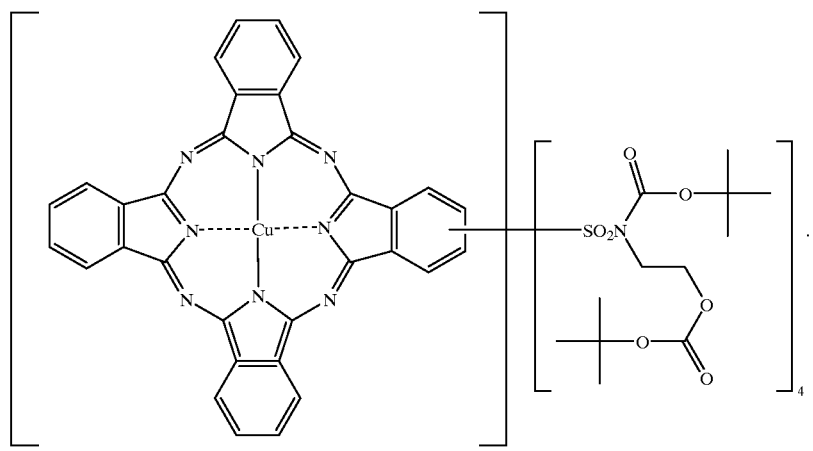

radical is bonded via one or more nitrogen atoms to x groups D and via one or more oxygen atoms to y groups E, the nitrogen atoms and oxygen atoms forming part of the radical A, each group D or E independently of any other(s) is hydrogen or a group of the formula

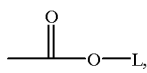

wherein at least one group D or E is not hydrogen, and L is any desired group suitable for solubilization, in the presence of a base as catalyst, in which method the reaction takes place in an aromatic or heteroaromatic solvent selected from diphenyl, pyridine, quinoline, pyrrole and benzene unsubstituted or mono- to tri-substituted by $C_1$–$C_{24}$alkyl, phenyl, benzyl, $C_1$–$C_{24}$alkoxy, phenoxy, $C_1$–$C_{24}$alkylthio, halogen and/or by nitro, and any desired mixtures thereof.

2. A method according to claim 1, wherein the aromatic solvent is benzene that is unsubstituted or mono- to tri-substituted by $C_1$–$C_6$alkyl, $C_1$–$C_6$alkoxy or by halogen.

3. (new) A method according to claim 1, wherein A is the radical of a chromophore of the monoazo, disazo or phthalocyanine series.

4. A method according to claim 1, wherein at least one group D that is other than hydrogen is bonded to the nitrogen atom of a hydrazone or sulfonamide group, or wherein at least one group E that is other than hydrogen is bonded to the oxygen atom of an enol, phenol or naphthol.

5. A method according to claim 1, wherein in the formula $A(D)_x(E)_y$ (I) from 4 to 8 groups D and E are not hydrogen.

6. A method according to claim 1, wherein in the formula $A(D)_x(E)_y$ (I) all the groups D and E are each a group of the formula

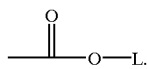

7. A method according to claim 1, wherein L is a group of the formula

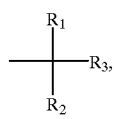

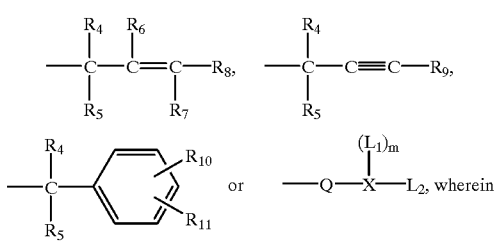

$R_1$, $R_3$ and $R_2$ are each independently of the others $C_1$–$C_6$alkyl, $R_4$ and $R_5$ are each independently of the other $C_1$–$C_6$alkyl, $C_1$–$C_6$alkyl interrupted by O, S or by $N(R_{12})$, unsubstituted or $C_1$–$C_6$alkyl-, $C_1$–$C_6$alkoxy-, halo-, cyano- or nitro-substituted phenyl or biphenyl, $R_6$, $R_7$ and $R_8$ are each independently of the others hydrogen or $C_1$–$C_6$alkyl, $R_9$ is hydrogen, $C_1$–$C_6$alkyl or a group of the formula

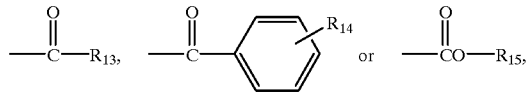

$R_{10}$ and $R_{11}$ are each independently of the other hydrogen, $C_1$–$C_6$alkyl, $C_1$–$C_6$alkoxy, halogen, cyano, nitro, $N(R_{12})_2$, unsubstituted or halo-, cyano-, nitro-, $C_1$–$C_6$alkyl- or $C_1$–$C_6$alkoxy-substituted phenyl, $R_{12}$ and $R_{13}$ are $C_1$–$C_6$alkyl, $R_{14}$ is hydrogen or $C_1$–$C_6$alkyl and $R_{15}$ is hydrogen, $C_1$–$C_6$alkyl, unsubstituted or $C_1$–$C_6$alkyl-substituted phenyl, Q is p,q-$C_2$–$C_6$alkylene that is unsubstituted or mono- or poly-substituted by $C_1$–$C_6$alkoxy, $C_1$–$C_6$alkylthio or by $C_2$–$C_{12}$dialkylamino, wherein p and q are different position numbers, X is a hetero atom selected from the group consisting of N, O and S, m being the number 0 when X is O or S and the number 1 when X is N, and $L_1$ and $L_2$ are each independently of the other [-(p',q'-$C_2$–$C_6$alkylene)Z—]$_n$—$C_1$–$C_6$alkyl or $C_1$–$C_6$alkyl unsubstituted or mono- or poly-substituted by $C_1$–$C_{12}$alkoxy, $C_1$–$C_{12}$alkylthio, $C_2$–$C_{24}$dialkylamino, $C_6$–$C_{12}$aryloxy, $C_6$–$C_{12}$arylthio, $C_7$–$C_{24}$alkylarylamino or by $C_{12}$–$C_{24}$diarylamino, wherein n is a number from 1 to 1000, p' and q' are different position numbers, each Z independently of the other(s) is a hetero atom O, S or $C_1$ $C_{12}$alkyl-substituted N, and $C_2$–$C_6$alkylene in the repeating units [—$C_2$–$C_6$alkylene-Z—] may be the same or different, and $L_1$ and $L_2$ may be saturated or unsaturated from 1 to 10 times, may be uninterrupted or interrupted at any desired positions by from 1 to 10 groups selected from the group consisting of —(C═O)— and —$C_6H_4$—, and may carry no further substituents or from 1 to 10 further substituents selected from the group consisting of halogen, cyano and nitro.

8. A method according to claim 1, wherein from 5 to 50 parts by weight of aromatic or heteroaromatic solvent are used, based on 1 part by weight of compound of the formula $A(H)_x(H)_y$.

9. A method according to claim 1, wherein the temperature is from 0 to 160° C. and the reaction time is from ½ to 80 hours.

10. A method according to claim 1, wherein the catalyst is an alkali metal or alkaline earth metal, or a hydroxide, carbonate, amide, hydride or alcoholate thereof, or an organic aliphatic, aromatic or heterocyclic nitrogen base, or a mixture thereof.

11. A method according to claim 1, wherein the amount of catalyst is from 0.005 to 2 mol, preferably from 0.02 to 1 mol, especially from 0.1 to 0.4 mol, times the number of groups D and E in the molecule of the product of the formula $A(D)_x(E)_y$ (I) that are other than hydrogen, based on 1 mol of compound of the formula $A(H)_x(H)_y$.

12. A method according to claim 1, wherein the compound of the formula $A(H)_x(H)_y$ is Color Index Pigment Yellow 13, Pigment Yellow 93, Pigment Yellow 94, Pigment Yellow 95, Pigment Yellow 128, Pigment Yellow 154, Pigment Red 185 or Pigment Red 222.

* * * * *

UNITED STATES PATENT AND TRADEMARK OFFICE
CERTIFICATE OF CORRECTION

PATENT NO. : 6,365,720 B1
DATED : April 2, 2002
INVENTOR(S) : Hans-Thomas Schacht et al.

It is certified that error appears in the above-identified patent and that said Letters Patent is hereby corrected as shown below:

<u>Title page,</u>
Item [87] should read:
--     PCT Pub. No. WO00/39221
        PCT Pub. Date: Jul. 6, 2000 --.

Signed and Sealed this

Seventeenth Day of September, 2002

Attest:

JAMES E. ROGAN
*Attesting Officer*      *Director of the United States Patent and Trademark Office*